United States Patent
Vakada et al.

(10) Patent No.: US 9,852,954 B2
(45) Date of Patent: Dec. 26, 2017

(54) METHODS OF FORMING TRANSISTORS WITH RETROGRADE WELLS IN CMOS APPLICATIONS AND THE RESULTING DEVICE STRUCTURES

(71) Applicant: GLOBALFOUNDRIES Inc., Grand Cayman (KY)

(72) Inventors: Vara G. Reddy Vakada, Clifton Park, NY (US); Laegu Kang, Hopewell Junction, NY (US); Michael Ganz, Clifton Park, NY (US); Yi Qi, Fishkill, NY (US); Puneet Khanna, Clifton Park, NY (US); Srikanth Balaji Samavedam, Fishkill, NY (US); Sri Charan Vemula, Clifton Park, NY (US); Manfred Eller, Beacon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 61 days.

(21) Appl. No.: 14/882,640

(22) Filed: Oct. 14, 2015

(65) Prior Publication Data
US 2016/0035630 A1    Feb. 4, 2016

Related U.S. Application Data

(62) Division of application No. 13/918,536, filed on Jun. 14, 2013, now Pat. No. 9,209,181.

(51) Int. Cl.
*H01L 21/8238* (2006.01)
*H01L 27/092* (2006.01)

(52) U.S. Cl.
CPC ........... *H01L 21/823892* (2013.01); *H01L 21/823807* (2013.01); *H01L 27/092* (2013.01); *H01L 27/0928* (2013.01)

(58) Field of Classification Search
CPC ............ H01L 21/823807; H01L 21/823892
See application file for complete search history.

(56) References Cited

U.S. PATENT DOCUMENTS

| 8,476,706 B1 | 7/2013 | Chidambarrao et al. |
| 8,815,699 B2 * | 8/2014 | Weihua ............ H01L 21/82380 257/E21.082 |

(Continued)

OTHER PUBLICATIONS

Hokazono et al., "Steep Channel & Halo Profiles utilizing Boron-Diffusion-Barrier Layers (Si:C) for 32 nm Node and Beyond," 2008 Symposium on VLSI Technology Digest of Technical Papers, pp. 112-113, 2008.

(Continued)

*Primary Examiner* — Davienne Monbleau
*Assistant Examiner* — Leslie Pilar Cruz
(74) *Attorney, Agent, or Firm* — Amerson Law Firm, PLLC

(57) ABSTRACT

One illustrative method disclosed herein includes performing a first plurality of epitaxial deposition processes to form a first plurality of semiconductor materials selectively above the N-active region while masking the P-active region, performing a second plurality of epitaxial deposition processes to form a second plurality of semiconductor materials selectively above the P-active region while masking the N-active region, forming an N-type transistor in and above the N-active region and forming a P-type transistor in and above the P-active region.

19 Claims, 6 Drawing Sheets

(56) References Cited

U.S. PATENT DOCUMENTS

| | | | |
|---|---|---|---|
| 9,099,525 B2 * | 8/2015 | Kang | H01L 21/76224 |
| 2002/0033511 A1 | 3/2002 | Babcock et al. | |
| 2009/0166685 A1 * | 7/2009 | Hokazono | H01L 21/26513 |
| | | | 257/288 |
| 2009/0283842 A1 * | 11/2009 | Hokazono | H01L 21/82341 |
| | | | 257/392 |
| 2010/0213553 A1 | 8/2010 | Hargrove et al. | |
| 2014/0353717 A1 * | 12/2014 | Loubet | H01L 27/092 |
| | | | 257/192 |

OTHER PUBLICATIONS

Hokazono et al., "Steep Channel Profiles in n/pMOS Controlled by Boron-doped Si:C Layers for a Continual Bulk-CMOS Scaling," IEDM09-673-676, 2009.

* cited by examiner

METHODS OF FORMING TRANSISTORS WITH RETROGRADE WELLS IN CMOS APPLICATIONS AND THE RESULTING DEVICE STRUCTURES

BACKGROUND OF THE INVENTION

1. Field of the Invention

Generally, the present disclosure relates to the manufacture of sophisticated semiconductor devices, and, more specifically, to various methods of forming transistor devices with retrograde wells in CMOS (Complementary Metal Oxide Semiconductor) applications, and the resulting device structures.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region. The above description is applicable for both the N-type FET as well as the P-type FET, except that the polarity of voltage in operation and the doping type of the source, the channel and the drain regions are correspondingly reversed. In so-called CMOS (Complementary Metal Oxide Semiconductor) technology, both N-type and P-type MOSFETs (which are referred to as being "complementary" to each other) are used in integrated circuit products. CMOS technology is the dominant technology as it relates to the manufacture of almost all current-day large scale logic and memory circuits.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain, which is commonly referred to as a "punch-through" of the electrical potential from the drain to the source and leads to larger leakage currents. This is sometimes referred to as a so-called short channel effect, wherein the characteristic of the FET as an active switch is degraded.

In contrast to a planar FET, which has a planar structure, there are so-called three-dimensional (3D) devices, such as an illustrative FinFET device, which is a three-dimensional structure. More specifically, in a FinFET, a generally vertically positioned, fin-shaped active area is formed and a gate electrode encloses both of the sides and the upper surface of the fin-shaped active area to form a "tri-gate" structure so as to use a channel having a 3D "fin" structure instead of a planar structure. In some cases, an insulating cap layer, e.g., silicon nitride is positioned at the top of the fin and the FinFET device only has a dual-gate structure. Unlike a planar FET, in a FinFET device, a channel is formed perpendicular to a surface of the semiconducting substrate so as to reduce the depletion width in the "fin" channel (as a result of the better electrostatic characteristics of the tri-gate or dual-gate structure around the fin channel) and thereby reduce so-called short channel effects. Also, in a FinFET, the junction capacitance at the drain region of the device is greatly reduced, which tends to reduce at least some short channel effects.

In one embodiment, FinFET devices have been formed on so-called silicon-on-insulator (SOI) substrates. An SOI substrate includes a bulk silicon layer, an active layer and a buried insulation layer made of silicon dioxide (a so-called "BOX" layer) positioned between the bulk silicon layer and the active layer. Semiconductor devices are formed in and above the active layer of an SOI substrate. The fins are formed in the active layer and the buried insulation layer provides good isolation between adjacent fins. The processes used to form FinFET devices on SOI substrates have relatively good compatibility with various processes that are performed when forming planar transistor devices in CMOS applications. For example, in both applications, the gate stack and the gate insulation layer can be made of the same materials (as in planar CMOS on SOI), e.g., poly-SiON or high-k/metal-gate (HKMG), and both applications may involve performing various epitaxial silicon growth processes (e.g., SiGe for PMOS and raised SD for NMOS) as well as the formation of episilicon material on the fins so as to define the source/drain regions from the FinFET devices that provide good resistance and desirable stress characteristics. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive current than planar transistor devices. Additionally, the leakage current of FinFET devices after the device is turned "OFF" is significantly reduced as compared to the leakage current of planar transistor MOSFETs due to the superior gate electrostatic control of the "fin" channel on FinFET devices. In short, the 3D structure of a FinFET device is a superior MOSFET structure as compared to that of a planar MOSFET, especially in the 20 nm CMOS technology node and beyond.

The formation of transistor devices in CMOS technology has also evolved and continues to evolve to produce devices with improved operational characteristics. One relatively recent advance involves the use of low channel doping (i.e., super-steep channel doping profiles) for deeply depleted channel regions during device operation, where there are multiple epi layers (i.e., Boron-doped-Silicon (Si:B), Carbon-doped Silicon (Si:C) and non-doped Silicon) formed above N/P wells. In such a device, the suppression of boron (B), phosphorous (P) and arsenic (As) diffusion is mainly due to the presence of the carbon-doped silicon layer (Si:C) layer. Alternatively, instead of using epitaxial growth processes, the B-doped and C-doped silicon layers can be formed by implanting boron and carbon into the silicon substrate in both the N and P active regions of the substrate. The low doping of the channel region may suppress or reduce the so-called "short-channel effect" typically found on traditional planar transistor devices manufactured on bulk silicon, reduce variations in the threshold voltages of such devices (due to less random dopant fluctuations), reduce source/drain leakage currents (by punch-through suppression by those doped layers below the channel) and lower junction capacitances. Therefore, MOSFET devices formed on a bulk substrate with a low doped channel can enjoy the advantages of devices with fully depleted channel regions during operations as if they are fabricated on an SOI substrate.

It is generally known that fully depleted devices with a substantially un-doped or low-doped channel region are effective in reducing threshold voltage variability due to the elimination of random dopant fluctuations in such devices, and that such devices exhibit improved device performance with relatively low dynamic power requirements, low leakage currents and relatively high transistor density. The fully depleted devices can take the form of planar transistor devices with ultra-thin bodies formed on SOI substrates or three-dimensional devices, such as FINFET devices. However, the planar devices consume a substantial amount of plot space (or foot-print) in the channel width direction and, with respect to FINFET technology, there are significant challenges in forming deep fin/isolation trenches and filling such trenches without creating undesirable voids.

The present disclosure is directed to various methods of forming transistor devices with retrograde wells in CMOS applications, and the resulting device structures, that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming transistor devices with retrograde wells in CMOS applications, and the resulting device structures. One illustrative method disclosed herein includes forming an N-active region and a P-active region in a semiconductor substrate and performing a common etching process to form recesses in the N-active region and the P-active region such that the N-active region and the P-active region have recessed surfaces. In this example, the method further includes performing a first plurality of epitaxial deposition processes to form a first plurality of semiconductor materials selectively above the N-active region while masking the P-active region, wherein performing the first plurality of epitaxial deposition processes includes forming a layer of silicon-carbon on the recessed surface of the N-active region and forming a first layer of a first semiconductor material on the layer of silicon-carbon, and performing a second plurality of epitaxial deposition processes to form a second plurality of semiconductor materials selectively above the P-active region while masking the N-active region, wherein performing the second plurality of epitaxial deposition processes includes forming a second layer of the first semiconductor material on the recessed surface of the P-active region and forming a layer of a second semiconductor material on the second layer of the first semiconductor material, wherein the first semiconductor material is a different semiconductor material from the second semiconductor material. The method also includes forming an N-type transistor in and above the N-active region and forming a P-type transistor in and above the P-active region.

Another illustrative method disclosed herein involves forming an N-active region and a P-active region in a semiconductor substrate, forming a first masking layer that covers the P-active region while leaving an area above the N-active region un-masked, forming a layer of silicon-carbon on an upper surface of the N-active region, performing a common deposition process to form a first portion of a layer of a first semiconductor material on the layer of silicon-carbon and a second portion of the first semiconductor material on an upper surface of the P-active region, masking the N-active region while leaving an area above the P-active region un-masked, forming a layer of a second semiconductor material on the second portion of the first semiconductor material, forming an N-type transistor in and above the N-active region and forming a P-type transistor in and above the P-active region.

Yet another illustrative method disclosed herein includes forming an N-active region and a P-active region in a semiconductor substrate, masking the P-active region, forming a layer of silicon-carbon on an upper surface of the N-active region and forming a first layer of a first semiconductor material on the layer of silicon-carbon, masking the N-active region, forming a second layer of the first semiconductor material on an upper surface of the P-active region and forming a layer of a second semiconductor material on the second layer of the first semiconductor material, forming an N-type transistor in and above the N-active region and forming a P-type transistor in and above the P-active region.

Yet another illustrative method disclosed herein involves forming an N-active region and a P-active region in a semiconductor substrate, masking the N-active region, forming a first layer of a first semiconductor material on an upper surface of the P-active region and forming a layer of a second semiconductor material on the first layer of the first semiconductor material, masking the P-active region, forming a layer of silicon-carbon on an upper surface of the N-active region and forming a second layer of the first semiconductor material on the layer of silicon-carbon, forming an N-type transistor in and above the N-active region and forming a P-type transistor in and above the P-active region.

One illustrative device disclosed herein includes a substrate comprised of an N-active region and a P-active region, a layer of silicon-carbon positioned on an upper surface of the N-active region, a first layer of a first semiconductor positioned on the layer of silicon-carbon, a second layer of the first semiconductor material positioned on an upper surface of the P-active region, a layer of a second semiconductor material positioned on the second layer of the first semiconductor material, an N-type transistor positioned above the N-active region and a P-type transistor positioned above the P-active region.

BRIEF DESCRIPTION OF THE DRAWINGS

The disclosure may be understood by reference to the following description taken in conjunction with the accompanying drawings, in which like reference numerals identify like elements, and in which.

Figure 1A:
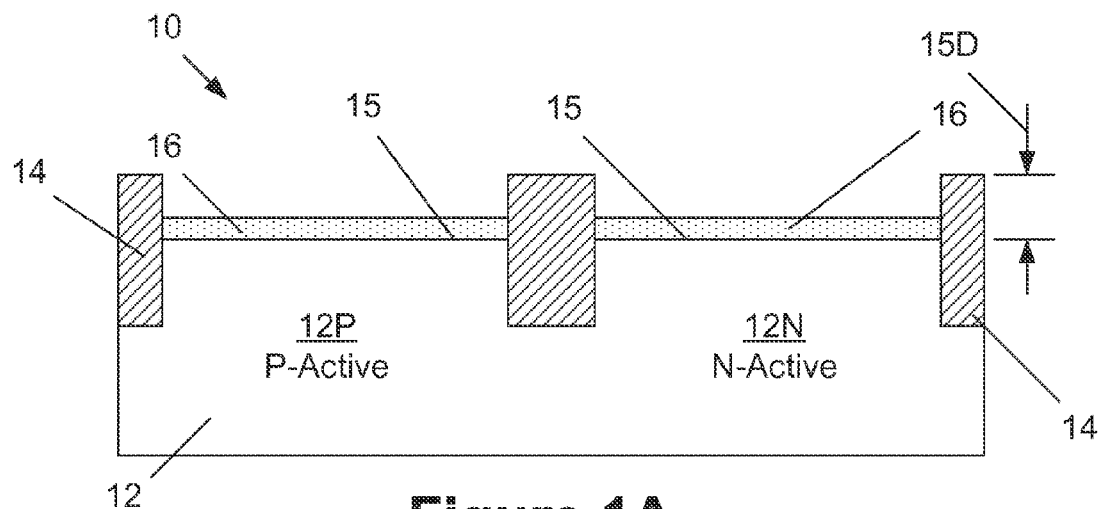
FIGS. 1A-1G depict one illustrative embodiment disclosed herein for forming transistor devices with retrograde wells in CMOS applications.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming transistor devices with retrograde wells in CMOS applications, and the resulting device structures. As will be readily apparent to those skilled in the art upon a complete reading of the present application, the novel methods and devices disclosed herein may be employed in manufacturing a variety of different devices, including, but not limited to, logic devices, memory devices, ASICs, etc. With reference to the attached figures, various illustrative embodiments of the methods and devices disclosed herein will now be described in more detail.

FIGS. 1A-1G show a simplified view of one illustrative embodiment of an integrated circuit product or device 10 disclosed herein at an early stage of manufacturing. The device 10 is formed above an illustrative substrate 12. The substrate 12 may have a variety of configurations, such as the depicted bulk substrate configuration. The substrate 12 may also have an SOI (silicon-on-insulator) configuration wherein the semiconductor devices are formed in the active layer of the SOI substrate. The substrate 12 may be made of silicon or it may be made of materials other than silicon. Thus, the terms "substrate," "semiconductor substrate" or "semiconducting substrate" should be understood to cover all semiconducting materials and all forms of such materials. The inventions disclosed herein will be disclosed in the context of forming planar transistor devices for the integrated circuit product 10. However, as will be recognized by those skilled in the art after a complete reading of the present application, the inventions disclosed herein may be applied to the formation of planar FET devices as well as 3D devices, such as FinFET devices.

With continuing reference to FIG. 1A, a plurality of trench isolation structures 14 are formed in the substrate 12 using known masking, deposition and etching techniques. The trench isolation structures 14 separate the substrate 12 into a P-active region 12P, where a P-type transistor will be formed, and an N-active region 12N, where an N-type transistor will be formed. After the isolation regions 14 are formed, various doped regions are formed in the active regions 12P, 12N by performing known ion implantation processes and using appropriate masking layers. For example, various ion implantation processes would have been performed to form a so-called P-well (not shown) in the P-active region 12P and a so-called N-well (not shown) in the N-active region 12N. Thereafter, with continuing reference to FIG. 1A, a common etching process, such as a reactive ion etching (RIE) process or a wet etching process, may be performed on the substrate 12 to define recesses 15 in both the P-active region 12P and the N-active region 12N. The depth 15D of the recesses may vary depending upon the particular application, e.g., about 5-20 nm. The depth of the recesses 15 is typically optimized so as to avoid or minimize a step height difference between the completed active regions and the STI regions 14. After the recesses 15 are formed, so-called threshold voltage adjusting implantation processes may have been performed on both of the active regions 12P, 12N, using the appropriate masking layers during such implantation processes. One or more anneal processes may then be performed to drive-in the various implanted materials. Note, however, using the methods disclosed herein, the substrate 12 is not subjected to the typical carbon ion implantation process that is performed to form doped carbon regions that act as a diffusion barrier layer to prevent the diffusion of the implanted materials that define the P-well and N-well back into the channel regions of the transistor devices that will be formed above the active regions 12P, 12N. Also depicted in FIG. 1A is an illustrative insulating layer 16, e.g., a pad oxide layer that has been formed on the active regions 12P, 12N by performing a thermal oxidation process.

Figure 1B:
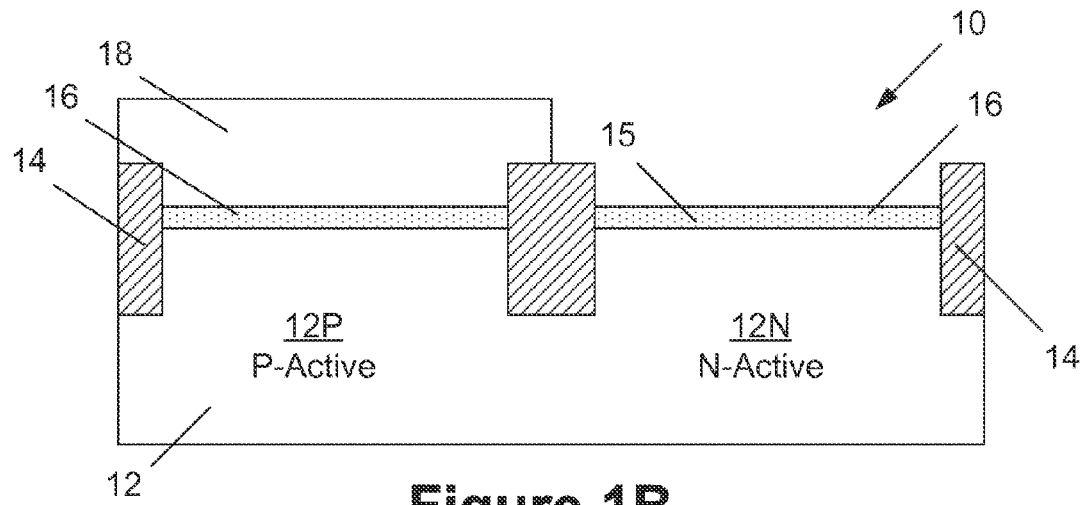

FIG. 1B depicts the device 10 after a patterned hard mask layer 18 has been formed above the P-active region 12P. The patterned hard mask layer 18 leaves the area above the N-active region 12N exposed or un-masked for further processing. The patterned hard mask layer 18 may be comprised of a variety of materials, e.g., silicon nitride, and its thickness may vary depending upon the particular application, e.g., 30-40 nm. The patterned mask layer 18 may be formed by blanket-depositing a layer of the hard mask material across the substrate 12, forming a patterned photoresist mask layer (not shown) above the layer of hard mask material and thereafter performing an etching process through the patterned photoresist mask layer to thereby remove the exposed portions of the deposited layer of hard mask material. The patterned photoresist mask may be formed using known photolithography tools and techniques. The initial layer of hard mask material may be deposited using a variety of known deposition processes, e.g., a chemical vapor deposition (CVD) process. FIG. 1B depicts the device 10 after the patterned layer of photoresist (that was used in forming the patterned hard mask layer 18) has been removed.

Figure 1C:
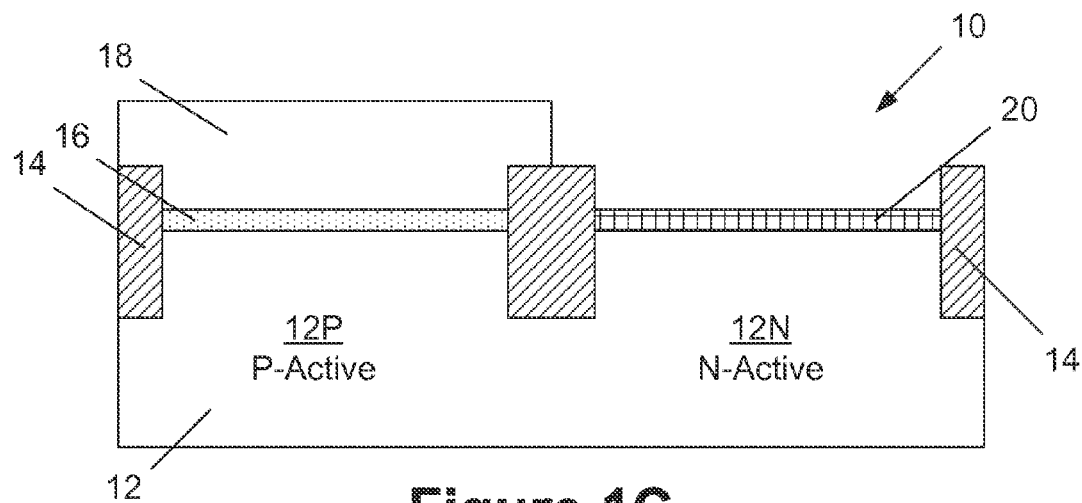

FIG. 1C depicts the product 10 after several process operations have been performed. First, with the patterned hard mask layer 18 in position, an etching/cleaning process was performed to remove the layer of insulating material 16 from above the N-active region 12N. This etching/cleaning process may be a traditional epi-preclean process that is performed prior to performing an epitaxial growth process on the exposed surface of the active region 12N. In one example, a chemical such as SiCoNi may be used as part of this cleaning process. Second, after the epi pre-clean process is performed such that the upper, recessed surface of the active region 12N is exposed and free of undesirable contaminants, a semiconductor material layer 20 was formed on the exposed surface of the N-active region 12N by performing an epitaxial deposition process. In one illustrative embodiment, the semiconductor material layer 20 is comprised of silicon-carbon (e.g., about 1-2% carbon) having a thickness of about 5-10 nm. In the illustrative case where the semiconductor material layer 20 is comprised of silicon-carbon, it may be formed in an epi-reactor using a mixture of $SiH_2Cl_2$ and $SiH_3CH_3$ as precursor materials supplied to the reactor at flow rates that fall within the range of about 3-10 sccm for $SiH_3CH_3$ and about 50-200 sccm for $SiH_2Cl_2$. The epitaxial deposition process may be performed at a temperature that falls within the range of about 600-800° C. at a pressure that falls within the range of about 10-20 Torr.

Figure 1D:
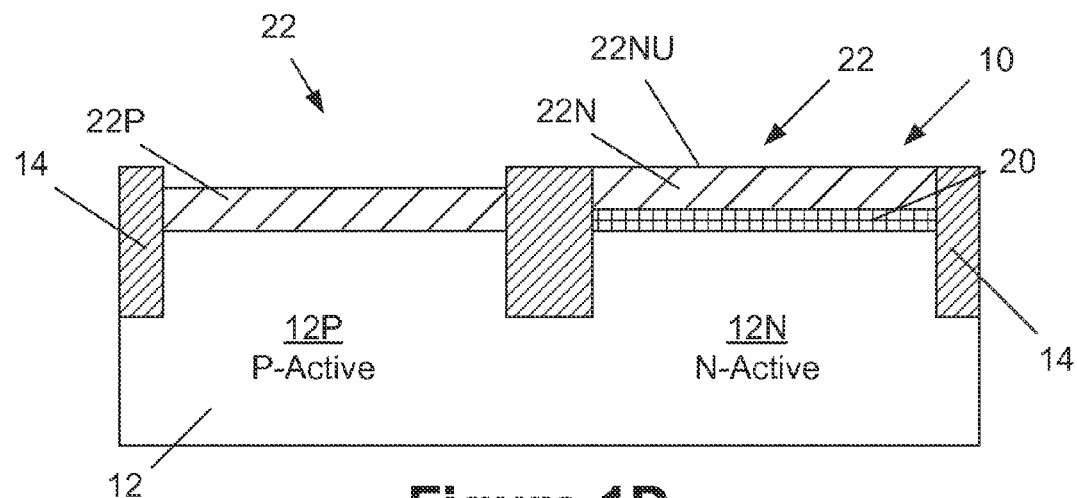

FIG. 1D depicts the product 10 after several additional process operations have been performed. First, the patterned hard mask layer 18 was removed. Second, another etching/cleaning process was performed to remove the layer of insulating material 16 from above the P-active region 12P and to clean the upper surface of the semiconductor material layer 20. This etching/cleaning process may be a traditional epi pre-clean process that is performed prior to performing an epitaxial growth process. Third, after the epi pre-clean process was performed, a semiconductor material layer 22 was formed above both of the active regions 12P, 12N. More specifically, a first portion 22P of the semiconductor material layer 22 was formed on the exposed, recessed surface of the P-active region 12P, while a second portion 22N of the semiconductor material layer 22 was formed on the semiconductor material layer 20. Note that both of the portions of the semiconductor material layer 22 depicted in FIG. 1D were formed in a single, common deposition process. In one illustrative embodiment, the semiconductor material layer 22 is comprised of silicon, and it has a thickness of about 5-15 nm. In the illustrative case where the semiconductor material layer 22 is comprised of silicon, it may be formed in an epi-reactor using $SiH_2Cl_2$ precursor materials supplied to the reactor at flow rates that fall within the range of about 150-250 sccm. The epitaxial deposition process may be performed at a temperature that falls within the range of about 700-800° C. at a pressure that falls within the range of about 10-20 Torr.

Figure 1E:
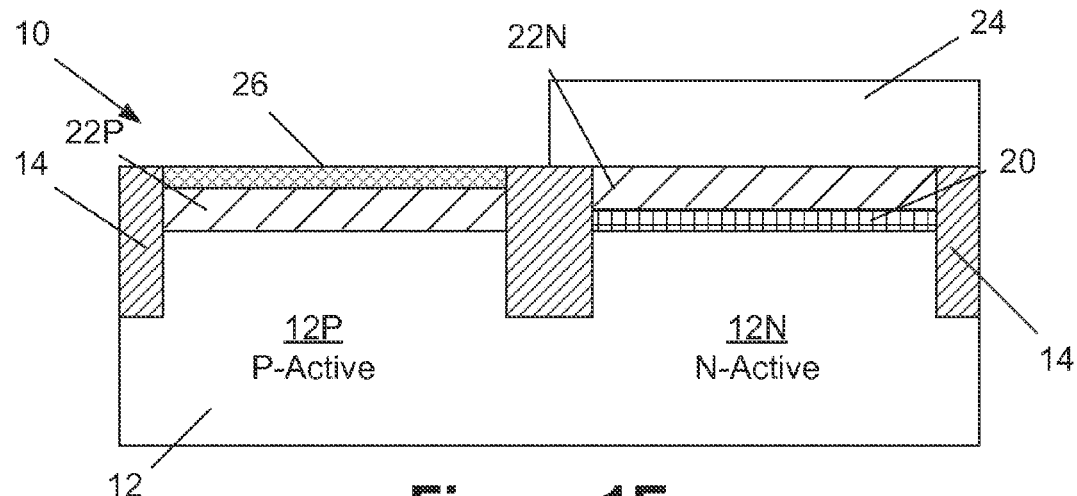

FIG. 1E depicts the device 10 after several additional process operations have been performed. First, a patterned hard mask layer 24 was formed above the N-active region 12N. The patterned hard mask layer 24 leaves the area above the P-active region 12P, and particularly the semiconductor material layer 22P, exposed or un-masked for further processing. The patterned hard mask layer 24 may be comprised of the same materials and formed using the same techniques as those described above for the patterned hard mask layer 18. Second, with the patterned hard mask layer 24 in position, an etching/cleaning process is performed to remove undesirable contaminants from the surface of the semiconductor material layer 22P. This may be accomplished by performing a traditional epi pre-clean process that is performed prior to performing an epitaxial growth process on the exposed surface of the semiconductor material layer 22P. Second, after the upper surface of the semiconductor material layer 22P is cleared of undesirable contaminants, a semiconductor material layer 26 is formed on the exposed surface of the semiconductor material layer 22P by performing an epitaxial deposition process. The semiconductor material layer 26 may be comprised of a variety of different semiconductor materials, e.g., silicon-germanium, a III-V material, etc., and it may have a thickness of about 10-15 nm. In one illustrative embodiment, the semiconductor material layer 26 is comprised of silicon-germanium having a thickness of about 10-15 nm. In the illustrative case where the semiconductor material layer 26 is comprised of silicon-germanium, it may be formed in an epi-reactor using $SiH_4$/$GeH_4$ precursor materials supplied to the reactor at flow rates that fall within the range of about 50-200 sccm for $SiH_4$ with about 10-50% being $GeH_4$. The epitaxial deposition process may be performed at a temperature that falls within the range of about 550-650° C. at a pressure that falls within the range of about 2-20 Torr.

Figure 1F:
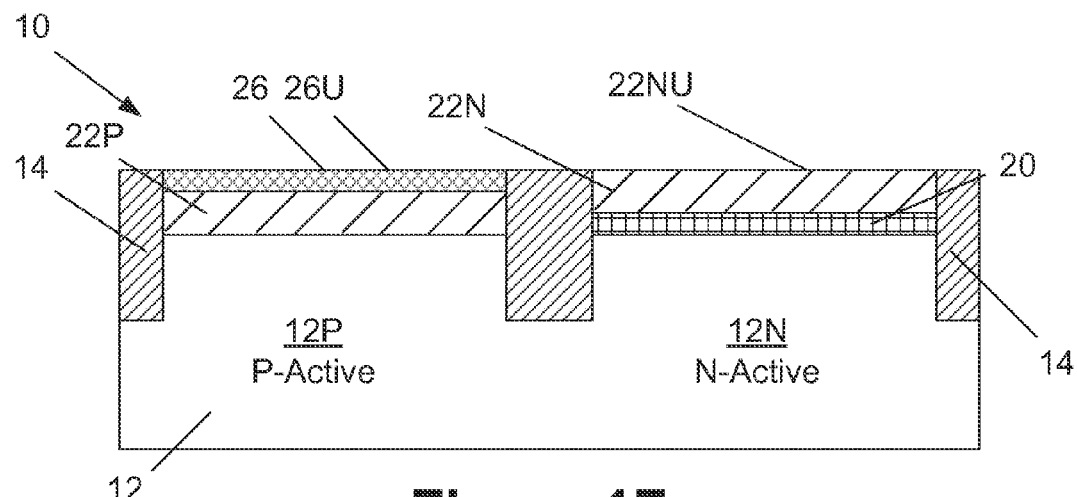

FIG. 1F depicts the device 10 after the patterned hard mask layer 24 has been removed. At this point, various semiconductor devices, e.g., transistors, may be formed in and above the active regions 12P, 12N. Note that, in the depicted example, the common deposition process described in connection with FIG. 1D above was performed in such a manner that the upper surface 22NU of the second portion 22N of the semiconductor material layer 22 is substantially level with an upper surface of the isolation region 14. Additionally, in the depicted example, the deposition process described in connection with FIG. 1E above was performed in such a manner that an upper surface 26U of the semiconductor material layer 26 is substantially level with an upper surface of the isolation region 14. Of course, the isolation region 14 for the active regions 12P, 12N, need not be the same region, i.e., the active regions 12P, 12N may be defined by totally separate isolation regions formed at spaced-apart locations in the substrate 12.

Figure 1G:
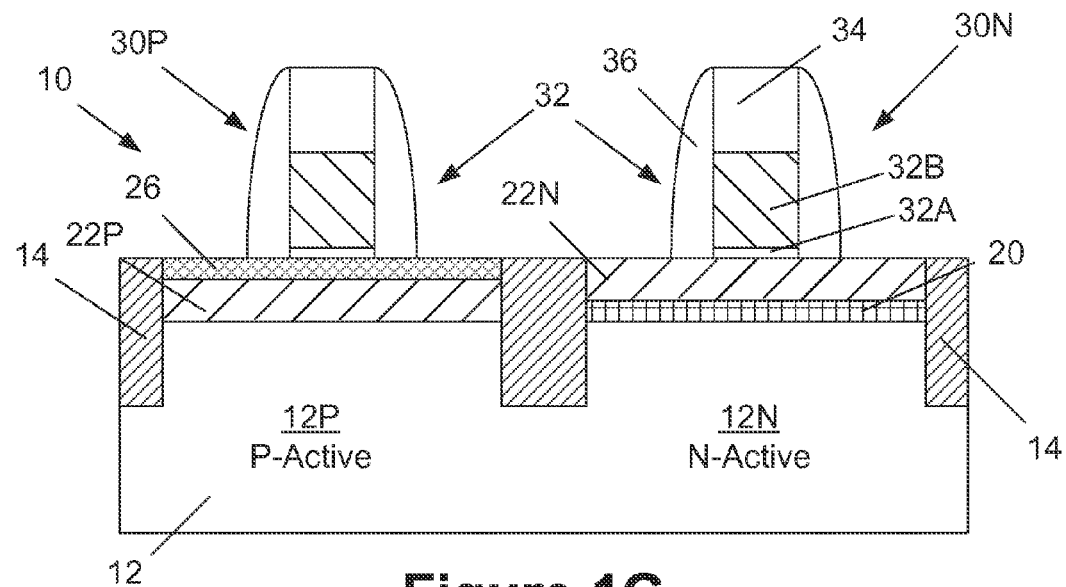

FIG. 1G depicts the device 10 after an illustrative and schematically depicted P-type transistor 30P and an illustrative and schematically depicted N-type transistor 30N have been formed in and above the active regions 12P, 12N, respectively. In the embodiment depicted in FIG. 1G, the transistors 30P, 30N are depicted as being planar transistor devices. However, as noted previously, the inventions disclosed herein may be applied to the formation of planar FET devices and/or 3D devices, such as FinFET devices, for a particular integrated circuit product 10. In the depicted example, each of the transistors 30P, 30N is comprised of a schematically depicted gate structure 32, a gate cap layer 34 and a sidewall spacer structure 36. The gate structures 32 are comprised of an illustrative gate insulation layer 32A and an illustrative gate electrode 32B. As will be recognized by those skilled in the art after a complete reading of the present application, the gate structures 32 of the device 10 depicted in the drawings, i.e., the gate insulation layer 32A and the gate electrode 32B, are intended to be representative in nature. For example, the gate insulation layer 32A may be comprised of a variety of different materials, such as, for example, silicon dioxide, a high-k (k greater than 10) dielectric material (where k is the dielectric constant), etc. The gate electrode 32B may be comprised or one or more layers of conductive material, e.g., doped polysilicon, one or more layers of metal, a metal nitride, etc. The gate structures 32 may be formed using either "gate-first" or "replacement gate" (also known as "gate-last") techniques. Moreover, the materials used for the gate structure 32 on the P-type transistor 30P may be different from the materials used for the gate structure 32 on the N-type transistor 30N. Although not depicted in FIG. 1G, at this point in the process flow, source/drain regions (not shown), e.g., raised or planar, would have been formed for the transistors 32P, 32N using traditional manufacturing techniques. At the point of fabrication depicted in FIG. 1G, traditional manufacturing techniques may be employed to complete the fabrication of the integrated circuit product 10, e.g., the formation of various contact structures, the formation of various metallization layers, etc.

Figure 2A:
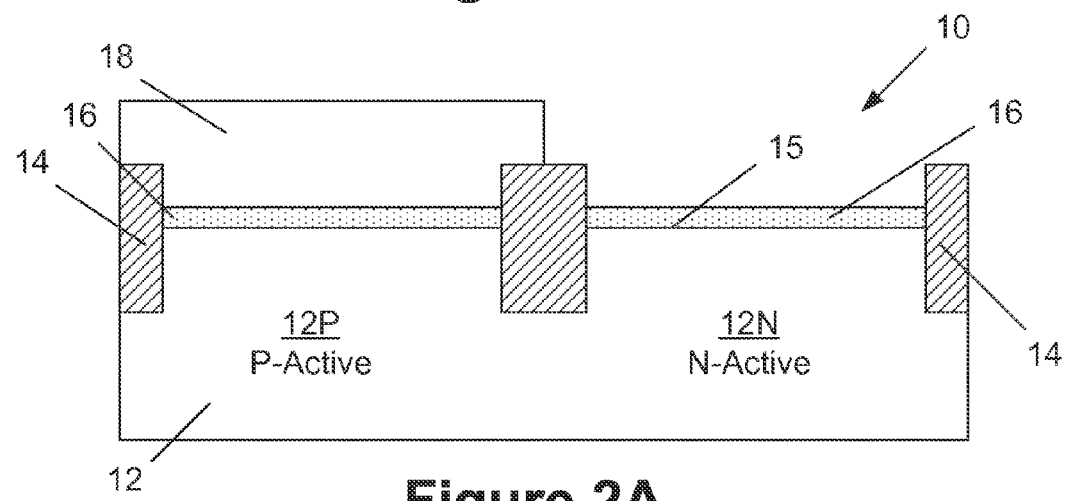
FIGS. 2A-2E depict another illustrative method disclosed herein of forming transistor devices with retrograde wells in CMOS applications.

FIGS. 2A-2E depict another illustrative method disclosed herein of forming transistor devices with retrograde wells in CMOS applications. FIG. 2A depicts the device at a point of fabrication that corresponds to that depicted in FIG. 1B, i.e., the patterned hard mask layer 18 has been formed above the P-active region 12P. The patterned hard mask layer 18 leaves the N-active region 12N exposed for further processing. FIG. 2A depicts the device 10 after the patterned layer of photoresist (that was used in forming the patterned hard mask layer 18) has been removed.

Figure 2B:
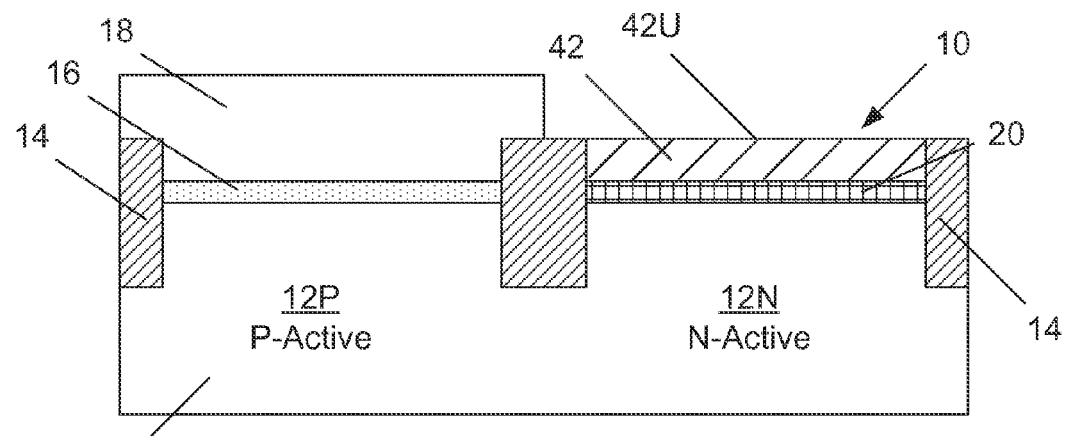

FIG. 2B depicts the product 10 after several process operations have been performed. First, with the patterned hard mask layer 18 in position, an etching/cleaning process was performed to remove the layer of insulating material 16 from above the N-active region 12N. Second, after the epi pre-clean process was performed, the above-described semiconductor material layer 20 was formed on the exposed recessed surface of the N-active region 12N by performing an epitaxial deposition process. Then, with the patterned mask layer 18 still in position, another etching/cleaning process was performed to clean the upper surface of the semiconductor material layer 20. After the epi pre-clean process was performed, a semiconductor material layer 42 was then formed on the semiconductor material layer 20. In this embodiment, the semiconductor material layer 42 may be made of the same materials as those described above for the semiconductor material layer 22. In one embodiment, the semiconductor material layer 42 may be formed such that the upper surface 42U of the semiconductor material layer 42 may be substantially level with the upper surface of the isolation region 14.

Figure 2C:
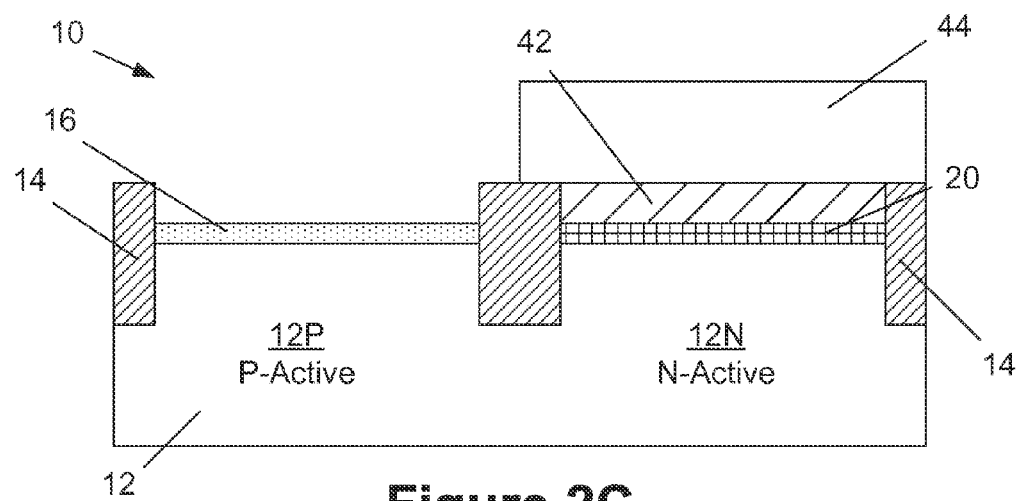

FIG. 2C depicts the device 10 after several additional process operations have been performed. First, the patterned hard mask layer 18 was removed. Thereafter, another patterned hard mask layer 44 was formed above the N-active region 12N. The patterned hard mask layer 44 leaves the P-active region 12P exposed or un-masked for further processing. The patterned hard mask layer 44 may be comprised of the same materials and formed using the same techniques as those described above for the patterned hard mask layer 18.

Figure 2D:
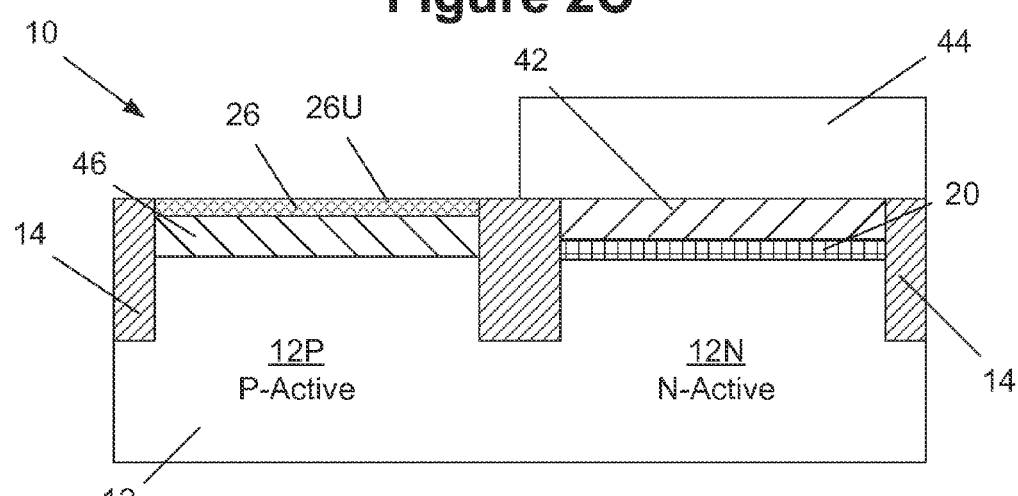

FIG. 2D depicts the device 10 after several other process operations were performed. First, with the patterned hard mask layer 44 in position, an etching/cleaning process was performed to remove the layer of insulating material 16 from above the P-active region 12P. In one embodiment, the removal of the layer of insulating material 16 may be part of a traditional epi pre-clean process that is typically performed prior to performing an epitaxial growth process. After the upper surface of the P-active region 12P was cleared of undesirable contaminants, a semiconductor material layer 46 was formed on the exposed surface of the P-active region 12P. In this embodiment, the semiconductor material layer 46 may be made of the same materials as those described above for the semiconductor material layer 22. Then, with the patterned mask layer 44 still in position, another etching/cleaning process was performed to clean the upper surface of the semiconductor material layer 46. After the cleaning process was performed, the above-described semiconductor material layer 26 was then formed on the semiconductor material layer 46. In one embodiment, the semiconductor material layer 26 may be formed such that the upper surface 26U of the semiconductor material layer 26 may be substantially level with the upper surface of the isolation region 14.

Figure 2E:
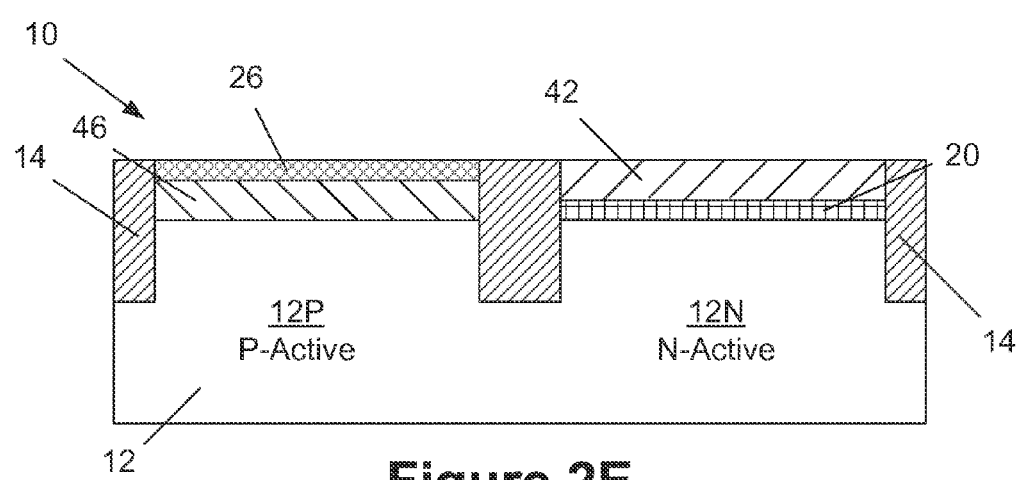

FIG. 2E depicts the device 10 after the patterned hard mask layer 44 has been removed. At this point, various semiconductor devices, such as the illustrative transistors 30P, 30N shown in FIG. 1G, may be formed in and above the active regions 12P, 12N, respectively.

FIGS. 3A-3E depict yet another illustrative method disclosed herein of forming transistor devices with retrograde wells in CMOS applications. Relative to the embodiment shown in FIGS. 2A-2E, in this embodiment, the various semiconductor materials are first formed above the P-active region 12P, followed by the formation of various semiconductor materials above the N-active region 12N.

Figure 3A:
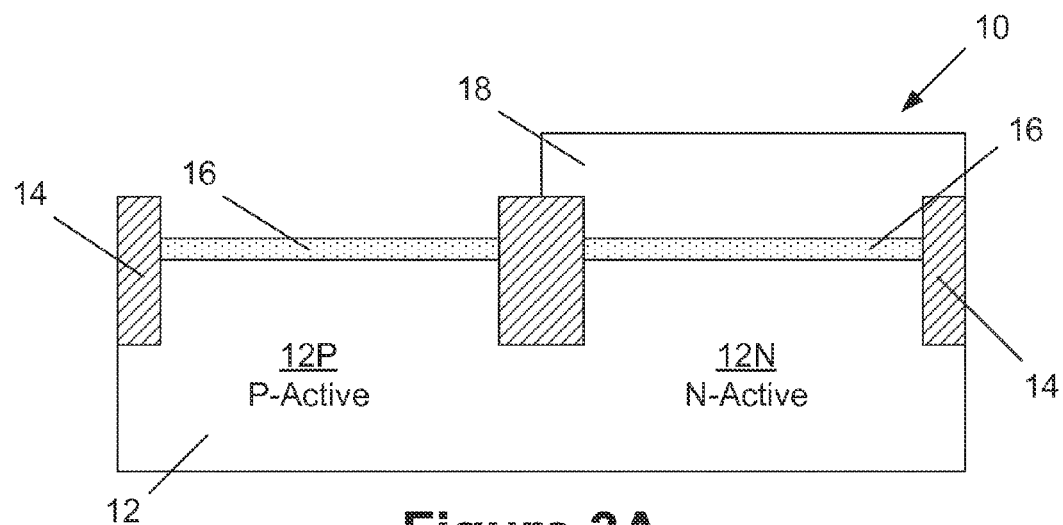
FIGS. 3A-3E depict yet another illustrative method disclosed herein of forming transistor devices with retrograde wells in CMOS applications.

FIG. 3A depicts the device at a point of fabrication that corresponds to that depicted in FIG. 1B with the notable exception that the patterned hard mask layer 18 has been formed above the N-active region 12N. In this example, the patterned hard mask layer 18 leaves the P-active region 12P exposed for further processing. FIG. 3A depicts the device 10 after the patterned layer of photoresist (that was used in forming the patterned hard mask layer 18) has been removed.

Figure 3B:
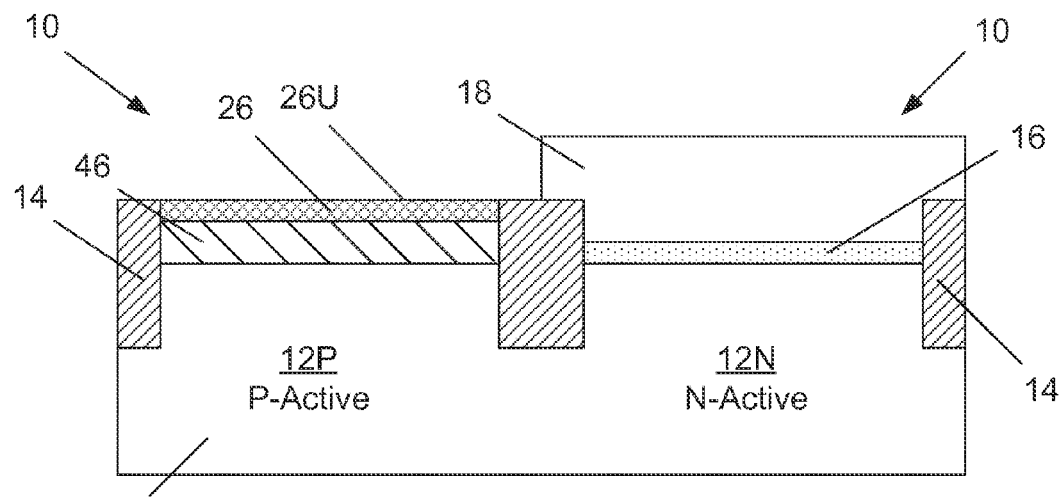

FIG. 3B depicts the product 10 after several process operations have been performed. First, with the patterned hard mask layer 18 in position, an etching/cleaning process was performed to remove the layer of insulating material 16 from above the P-active region 12P. Second, after the epi pre-clean process was performed, the above-described semiconductor material layer 46 was formed on the exposed surface of the P-active region 12P by performing an epitaxial deposition process. Then, with the patterned mask layer 18 still in position, another etching/cleaning process was performed to clean the upper surface of the semiconductor material layer 46. After the cleaning process was performed, the above-described semiconductor material layer 26 was then formed on the semiconductor material layer 46.

Figure 3C:
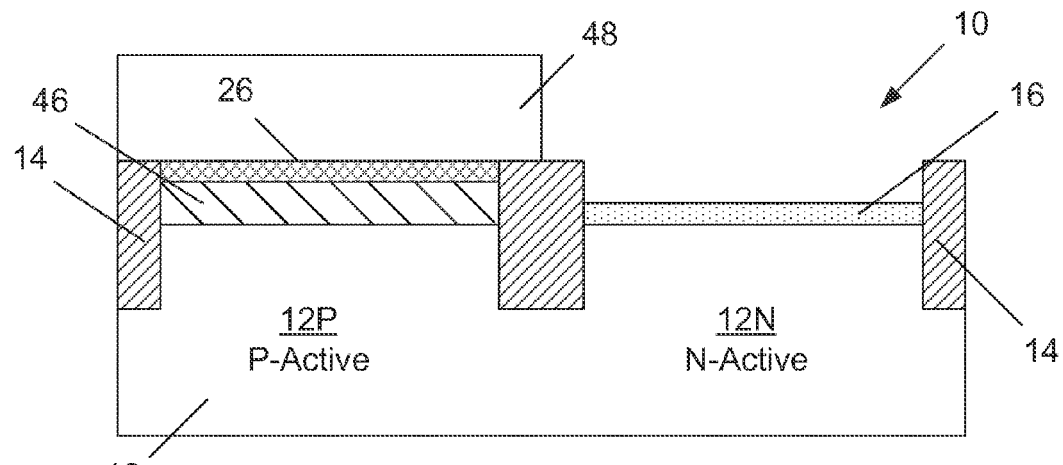

FIG. 3C depicts the device 10 after several other process operations have been performed. First, the patterned hard mask layer 18 was removed. Thereafter, another patterned hard mask layer 48 was formed above the P-active region 12P. The patterned hard mask layer 48 leaves the N-active region 12N exposed or un-masked for further processing. The patterned hard mask layer 48 may be comprised of the same materials and formed using the same techniques as those described above for the patterned hard mask layer 18.

Figure 3D:
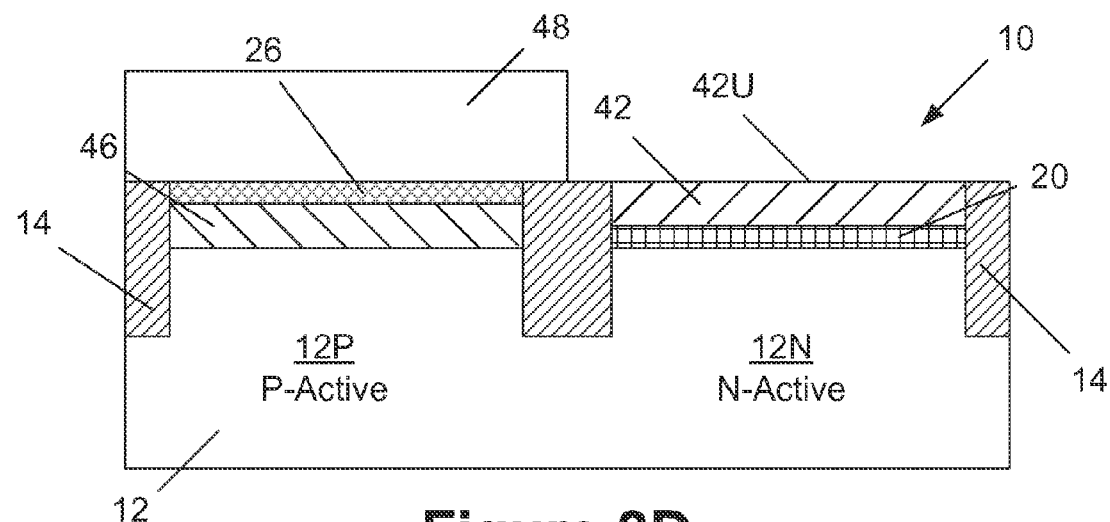

FIG. 3D depicts the device 10 after several additional process operations were performed. First, with the patterned hard mask layer 48 in position, an etching/cleaning process was performed to remove the layer of insulating material 16 from above the N-active region 12N. After the upper surface of the N-active region 12N was cleared of undesirable contaminants, the above-described semiconductor material layer 20 was formed on the exposed surface of the N-active region 12N. Then, with the patterned mask layer 48 still in position, another etching/cleaning process was performed to clean the upper surface of the semiconductor material layer 20. After the cleaning process was performed, the above-described semiconductor material layer 42 was then formed on the semiconductor material layer 20.

Figure 3E:
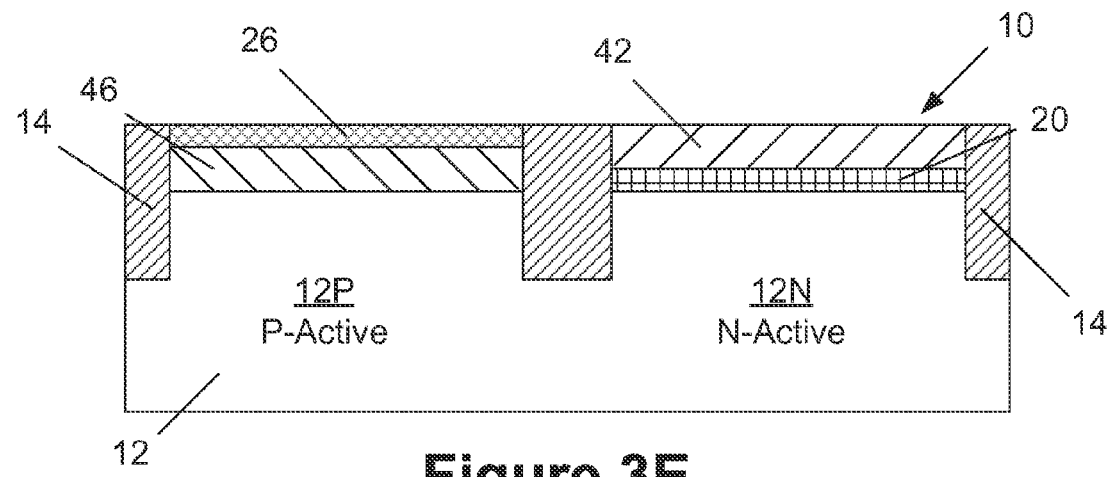

FIG. 3E depicts the device 10 after the patterned hard mask layer 48 has been removed. At this point, various semiconductor devices, such as the illustrative transistors 30P, 30N shown in FIG. 1G, may be formed in and above the active regions 12P, 12N, respectively.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an N-active region and a P-active region in a semiconductor substrate;
    performing a common etching process to form recesses in said N-active region and said P-active region such that said N-active region and said P-active region have recessed surfaces;
    performing a first plurality of epitaxial deposition processes to form a first plurality of semiconductor materials selectively above said N-active region while masking said P-active region, wherein performing said first plurality of epitaxial deposition processes comprises forming a layer of silicon-carbon on said recessed surface of said N-active region and forming a first layer of a first semiconductor material on said layer of silicon-carbon;
    performing a second plurality of epitaxial deposition processes to form a second plurality of semiconductor materials selectively above said P-active region while masking said N-active region, wherein performing said second plurality of epitaxial deposition processes comprises forming a second layer of said first semiconductor material on said recessed surface of said P-active region and forming a layer of a second semiconductor material on said second layer of said first semiconductor material, wherein said first semiconductor material is a different semiconductor material from said second semiconductor material;
    forming an N-type transistor in and above said N-active region; and
    forming a P-type transistor in and above said P-active region.

2. The method of claim 1, wherein said first semiconductor material comprises silicon.

3. The method of claim 2, wherein said second semiconductor material comprises silicon-germanium or a III-V material.

4. The method of claim 1, wherein said second semiconductor material comprises silicon-germanium or a III-V material.

5. The method of claim 1, wherein said N-active region is defined by a first isolation region positioned in said substrate and said P-active region is defined by a second isolation region positioned in said substrate, and wherein:
    at least one of said first plurality of epitaxial deposition processes is performed such that an upper surface of said first layer of said first semiconductor material that is formed on said layer of silicon-carbon is substantially level with an upper surface of said first isolation region; and
    at least one of said second plurality of epitaxial deposition processes is performed such that an upper surface of said layer of said second semiconductor material formed on said second layer of said first semiconductor material is substantially level with an upper surface of said second isolation region.

6. The method of claim 1, wherein said first plurality of epitaxial deposition processes are performed prior to performing said second plurality of epitaxial deposition processes.

7. The method of claim 1, wherein said second plurality of epitaxial deposition processes are performed prior to performing said first plurality of epitaxial deposition processes.

8. A method, comprising:
    forming an N-active region and a P-active region in a semiconductor substrate;
    performing a common etching process to form recesses in said N-active region and said P-active region such that said N-active region and said P-active region have recessed surfaces;
    forming a first masking layer that covers said N-active region while leaving an area above said P-active region un-masked;
    with said first masking layer in position, forming a first layer of a first semiconductor material on said recessed surface of said P-active region and forming a layer of a second semiconductor material on said first layer of said first semiconductor material, wherein said first semiconductor material is a different semiconductor material from said second semiconductor material;
    removing said first masking layer;
    after forming said layer of said second semiconductor material on said first layer of said first semiconductor material and removing said first masking layer, forming a second masking layer that covers said P-active region while leaving an area above said N-active region un-masked;
    with said second masking layer in position, forming a layer of silicon-carbon on said recessed surface of said N-active region and forming a second layer of said first semiconductor material on said layer of silicon-carbon;

removing said second masking layer;

forming an N-type transistor in and above said N-active region; and forming a P-type transistor in and above said P-active region.

9. The method of claim 8, wherein said first semiconductor material comprises silicon.

10. The method of claim 9, wherein said second semiconductor material comprises silicon-germanium or a III-V material.

11. The method of claim 8, wherein said second semiconductor material comprises silicon-germanium or a III-V material.

12. The method of claim 8, wherein said N-active region is defined by a first isolation region positioned in said substrate and said P-active region is defined by a second isolation region positioned in said substrate, and wherein:

said layer of said second semiconductor material is formed above said P-active region such that an upper surface of said layer of said second semiconductor material is substantially level with an upper surface of said second isolation region; and said layer of said second semiconductor material is formed above said N-active region such that an upper surface of said layer of said second semiconductor material is substantially level with an upper surface of said first isolation region.

13. The method of claim 8 wherein said first layer of said first semiconductor material is formed on and in contact with said recessed surface of said P-active region, said layer of said second semiconductor material is formed on and in contact with said first layer of said first semiconductor material, said layer of silicon-carbon is formed on and in contact with said recessed surface of said N-active region and said second layer of said first semiconductor material is formed on and in contact with said layer of silicon-carbon.

14. A method, comprising:

forming an N-active region and a P-active region in a semiconductor substrate;

performing a common etching process to form recesses in said N-active region and said P-active region such that said N-active region and said P-active region have recessed surfaces;

forming a first masking layer that covers said P-active region while leaving an area above said N-active region un-masked;

with said first masking layer in position, forming a layer of silicon-carbon on said recessed surface of said N-active region and forming a first layer of a first semiconductor material on said layer of silicon-carbon;

removing said first masking layer;

after forming said first layer of said first semiconductor material on said layer of silicon-carbon and removing said first masking layer, forming a second masking layer that covers said N-active region while leaving an area above said P-active region un-masked;

with said second masking layer in position, forming a second layer of said first semiconductor material on said recessed surface of said P-active region and forming a layer of a second semiconductor material on said second layer of said first semiconductor material, wherein said first semiconductor material is a different semiconductor material from said second semiconductor material;

removing said second masking layer;

forming an N-type transistor in and above said N-active region; and forming a P-type transistor in and above said P-active region.

15. The method of claim 14, wherein said first semiconductor material comprises silicon.

16. The method of claim 15, wherein said second semiconductor material comprises silicon-germanium or a III-V material.

17. The method of claim 14, wherein said second semiconductor material comprises silicon-germanium or a III-V material.

18. The method of claim 14, wherein said N-active region is defined by a first isolation region positioned in said substrate and said P-active region is defined by a second isolation region positioned in said substrate, and wherein:

said layer of said second semiconductor material is formed above said P-active region such that an upper surface of said layer of said second semiconductor material is substantially level with an upper surface of said second isolation region; and said layer of said second semiconductor material is formed above said N-active region such that an upper surface of said layer of said second semiconductor material is substantially level with an upper surface of said first isolation region.

19. The method of claim 14, wherein said layer of silicon-carbon is formed on and in contact with said recessed surface of said N-active region, said first layer of said first semiconductor material is formed on and in contact with said layer of silicon-carbon, said second layer of said first semiconductor material is formed on and in contact with said recessed surface of said P-active region, and said layer of said second semiconductor material is formed on and in contact with said second layer of said first semiconductor material.

* * * * *